(12) United States Patent
Koo et al.

(10) Patent No.: US 7,986,096 B2
(45) Date of Patent: Jul. 26, 2011

(54) DISPLAY DEVICE WITH MINIMIZED INFILTRATION OF OXYGEN AND MOISTURE AND MANUFACTURING METHOD THEREOF

(75) Inventors: Won-Hoe Koo, Suwon-si (KR); Hoon Kim, Hwaseong-si (KR); Jung-Mi Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 493 days.

(21) Appl. No.: 11/753,213

(22) Filed: May 24, 2007

(65) Prior Publication Data

US 2007/0291215 A1 Dec. 20, 2007

(30) Foreign Application Priority Data

Jun. 14, 2006 (KR) ........................ 10-2006-0053520

(51) Int. Cl.
H01L 51/00 (2006.01)
H01L 51/50 (2006.01)
H01L 51/52 (2006.01)
H01L 51/54 (2006.01)
(52) U.S. Cl. ......... 313/512; 313/506; 313/504; 313/509
(58) Field of Classification Search .......... 313/498–512; 428/690–691, 917
See application file for complete search history.

(56) References Cited

U.S. PATENT DOCUMENTS

| 2004/0095060 | A1* | 5/2004 | Ushifusa et al. | 313/495 |
| 2004/0263740 | A1* | 12/2004 | Sakakura et al. | 349/138 |
| 2005/0130391 | A1* | 6/2005 | Takayama et al. | 438/458 |
| 2005/0225238 | A1* | 10/2005 | Yamazaki | 313/506 |
| 2006/0197080 | A1* | 9/2006 | Yamazaki et al. | 257/40 |
| 2007/0159099 | A1* | 7/2007 | Takahashi et al. | 313/512 |
| 2007/0181246 | A1* | 8/2007 | Yamashita et al. | 156/235 |
| 2008/0171484 | A1* | 7/2008 | Yamashita et al. | 445/24 |

FOREIGN PATENT DOCUMENTS

| CN | 1578546 | 2/2005 |
| JP | 9185994 | 7/1997 |
| JP | 2004-171806 | 6/2004 |
| JP | 2005-302401 | 10/2005 |
| KR | 10-2002-0044891 | 6/2002 |
| KR | 10-2003-0042169 | 5/2003 |
| KR | 10-2003-0082256 | 10/2003 |
| KR | 10-2003-0096518 | 12/2003 |

* cited by examiner

*Primary Examiner* — Nimeshkumar D Patel
*Assistant Examiner* — Jose M Diaz
(74) *Attorney, Agent, or Firm* — H.C. Park & Associates, PLC

(57) ABSTRACT

A display device includes an insulating substrate on which a display element is disposed, a resin layer disposed on the display element and having a depressed portion formed along an edge of the insulating substrate, and a sealing layer formed on the resin layer, with a portion of the sealing layer extending into the depressed portion of the resin layer. A method of manufacturing a display element includes disposing a display element on an insulating substrate, disposing a resin layer on the display element, and partially curing the resin layer. A depressed portion in the resin layer is formed using a pressurizing member and a sealing layer is disposed on the resin layer.

12 Claims, 16 Drawing Sheets

DISPLAY DEVICE WITH MINIMIZED INFILTRATION OF OXYGEN AND MOISTURE AND MANUFACTURING METHOD THEREOF

CROSS-REFERENCE TO RELATED APPLICATIONS

This application claims priority from and the benefit of Korean Patent Application No. 10-2006-0053520, filed on Jun. 14, 2006, which is hereby incorporated by reference for all purposes as if fully set forth herein.

BACKGROUND OF THE INVENTION

1. Field of the Invention

The present invention relates to a display device and a manufacturing method thereof. More particularly, the present invention relates to a display device that may minimize infiltration of oxygen and moisture, and a manufacturing method thereof.

2. Discussion of the Background

The use of organic light emitting diode (OLED) technology in flat panel displays has been spotlighted recently because it provides for flat panel displays that have low driving voltages, are lightweight and thin, have wide viewing angles, and have high speed response times. An OLED device includes thin film transistors, each of which includes a gate electrode, a source electrode, and a drain electrode, pixel electrodes connected to the thin film transistors, a wall partitioning the pixel electrodes, light emitting layers disposed on the pixel electrodes between the walls, and a common electrode disposed on the light emitting layers.

A light emitting layer is a self-emissive element that may be made of an organic material. Moisture and oxygen have a great effect on the performance and durability of an organic light emitting layer. That is, the light emitting layer is susceptible to deterioration caused by moisture and oxygen. To prevent such deterioration of the light emitting layer, an insulating substrate, on which light emitting layers are disposed, may be bonded to a cover substrate. This may prevent the introduction of moisture and oxygen and is referred to as a sealing process. In addition, when the substrates are bonded together, a sealing resin, such as a sealant, is interposed between the insulating substrate and the cover substrate to prevent the introduction of moisture and oxygen.

However, sealing resins may still permit a relatively high amount of infiltration of moisture and oxygen, and thus, it may be difficult to effectively prevent moisture and oxygen from being introduced between the insulating substrate and the cover substrate.

SUMMARY OF THE INVENTION

The present invention provides a display device that may minimize infiltration of oxygen and moisture.

The present invention also provides a method of manufacturing such a display device.

Additional features of the invention will be set forth in the description which follows, and in part will be apparent from the description, or may be learned by practice of the invention.

The present invention discloses a display device including an insulating substrate on which a display element is disposed, a resin layer disposed on the display element and having a depressed portion formed along an edge of the insulating substrate, and a sealing layer disposed on the resin layer, wherein a portion of the sealing layer extends into the depressed portion in the resin layer.

The present invention also discloses a method of manufacturing a display device, the method including disposing a display element on an insulating substrate, disposing a resin layer on the display element, partially curing the resin layer, and disposing a sealing layer on the resin layer. The method further includes extending a portion of the sealing layer into a depressed portion formed in the resin layer by pressing the sealing layer toward the insulating substrate with a pressurizing member, the pressurizing member being provided with at least one projection projecting along an edge of the insulating substrate, and separating the pressurizing member from the sealing layer.

The present invention also discloses a method of manufacturing a display device, the method including disposing a display element on an insulating substrate, disposing a resin layer on the display element, partially curing the resin layer; and disposing a depressed portion in the resin layer by pressing the resin layer toward the insulating substrate with a pressurizing member, the pressurizing member being provided with at least one projection projecting along an edge of the insulating substrate. The method further includes disposing a sealing layer on the resin layer, with a portion of the sealing layer extending into the depressed portion in the resin layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
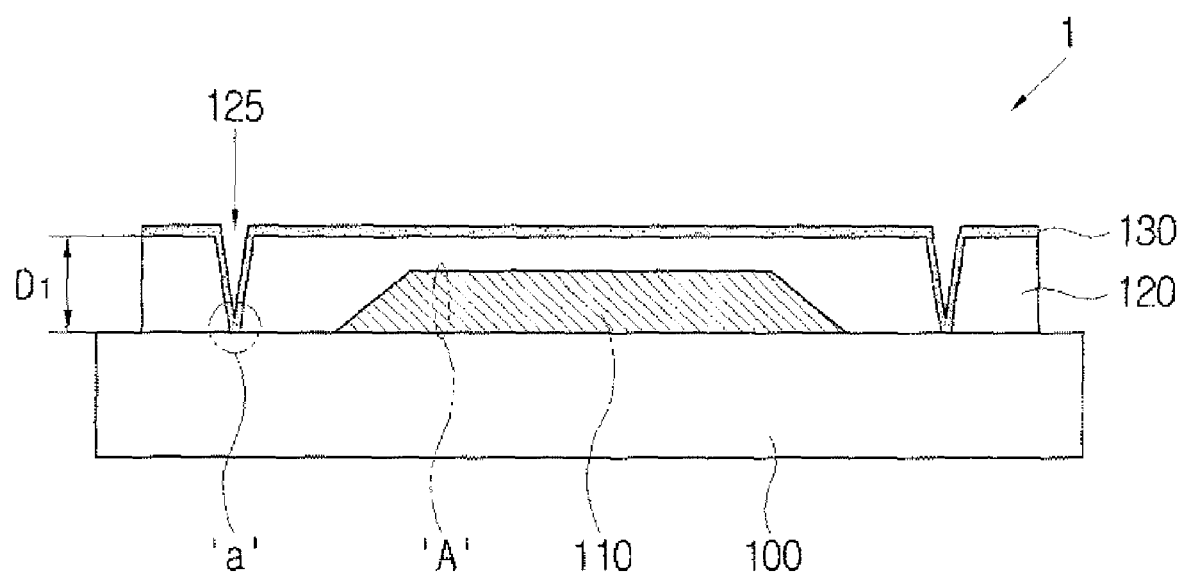
FIG. 1 is a sectional view of a display device according to a first exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
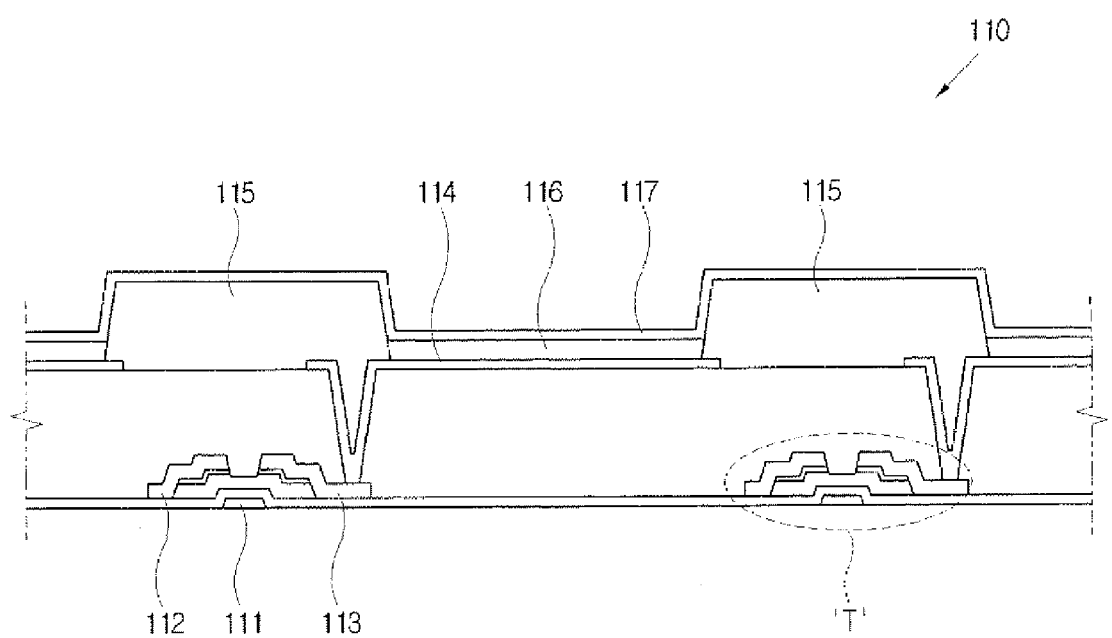
FIG. 2 is an enlarged view of a portion 'A' shown in FIG. 1.

FIG. 1 is a sectional view of a display device according to a first exemplary embodiment of the present invention, and FIG. 2 is an enlarged view of a portion 'A' shown in FIG. 1.

The OLED 1, shown in FIG. 1, includes a self-emission element made of an organic material, which emits light when an electric signal is applied thereto. Moisture and oxygen have a great effect on the performance and durability of the organic material. Thus, the present invention provides a sealing method that may effectively prevent oxygen and moisture from permeating into the organic material (organic light emitting layer).

As shown in FIG. 1, the OLED 1 includes an insulating substrate 100 on which a display element 110 to display an image is disposed, a resin layer 120 disposed on the insulating substrate 100 to cover the display element 110, and a sealing layer 130 disposed on the resin layer 120. A depressed portion 125 of a predetermined depth is formed in the resin layer 120 along an edge of the insulating substrate 100, such that a portion of the sealing layer 130 extends into the depressed portion 125 of the resin layer.

The insulating substrate 100 may include a transparent glass substrate or a transparent plastic substrate. Although not shown, a blocking layer (not shown) may also be disposed between the display element 110 and the insulating substrate 100. The blocking layer blocks oxygen or moisture, which may permeate into the display element 110 through the insulating substrate 100, and may be made of SiON, $SiO_2$, $SiN_x$, $Al_2O_3$, or the like. The blocking layer may be formed by a sputtering method or the like.

As shown in FIG. 2, the display element 110 includes thin film transistors T, each of which includes a gate electrode 111, a source electrode 112, and a drain electrode 113, pixel electrodes 114 connected to the thin film transistors T, walls 115 partitioning the pixel electrodes 114, an organic light emitting layer 116 disposed on the pixel electrodes 114 between the walls 115, and a common electrode 117 disposed on the organic light emitting layer 116. The display element 110 displays an image corresponding to an image signal input from an information processing apparatus.

The resin layer 120, which is disposed on the insulating substrate 100 to cover the display element 110, serves to protect the organic light emitting layer 116 from moisture and oxygen and is bonded together with the sealing layer 130, which will be described below. The resin layer 120 is formed with the depressed portion 125 along the edge of the insulating substrate 100.

The depressed portion 125 may be provided such that a portion of the insulating substrate 100 is exposed, as indicated by 'a' in FIG. 1, or alternatively, may be provided such that a portion of the insulating substrate 100 is not exposed. When wire lines are disposed in the region where the depressed portion 125 is formed, it is preferable, but not necessary, that the depressed portion 125 be formed such that a portion of the insulating substrate 100 is not exposed. This may protect the wire lines and prevent short-circuits between the wire lines and the sealing layer 130, which may be made of a conductive material. In addition, when the depressed portion 125 is formed such that a portion of the insulating substrate 100 is not exposed, it is preferable, but not necessary, that the thickness of the resin layer 120 between the depressed portion 125 and the insulating substrate 100 is small so that the amount of oxygen and moisture which permeates through the side of the resin layer 120 may be minimized.

The resin layer 120 may be made of an adhesive polymer, and it may include at least one of a sealant and a semi-curable adhesive resin formed by a taping process. The taping process refers to the process of attaching a semi-curable tape, which includes a polymer film 121, such as polyethylene terephthalate (PET), and a semi-curable adhesive resin 120a disposed on the polymer film 121, to the insulating substrate 100 on which the display element 110 is formed, by using a mechanical force, and then detaching the polymer film 121 from the semi-curable tape 120a, as shown in FIG. 3B. The thickness D2 of the semi-curable adhesive resin 120a disposed on the polymer film 121 may be 15 µm to 50 µm and, as described below, the pressing process may decrease the thickness D1 (see FIG. 1) of the resin layer 120 formed by the taping process.

Since a resin layer 120 formed by the taping process is typically thinner than a resin layer including a sealant, the resin layer 120 formed by the taping process may more effectively decrease the amount of oxygen and moisture that may permeate into the side of the resin layer 120 than the resin layer comprising the sealant. The resin layer 120 formed by the taping process may achieve a semi-curable state when subjected to heat or light. A semi-curable state refers to a partially-cured state in which the resin layer 120 can be pressurized to form a desired shape that it will maintain thereafter. The sealant may be made of an adhesive organic material and may include an acryl resin, an epoxy resin, or the like. A semi-curable state of the sealant may be achieved by controlling the light radiation level and the sealant exposure time, as well as the time and intensity of heat applied to the sealant. In a finished product, the sealant may be completely cured by further application of radiating light and heat.

The sealing layer 130 is disposed on the resin layer 120 and a portion of the sealing layer 130 extends into the depressed portion 125 of the resin layer. The sealing layer 130 may permit very little infiltration of oxygen and moisture, and thus, efficiently protects the organic light emitting layer 116. The sealing layer 130 may be made of at least one of a metal and an inorganic material.

When the resin layer 120 includes a semi-curable adhesive resin, the sealing layer 130 may include at least one of flexible aluminum foil, copper foil, bronze foil, silver foil, brass (Cu/Zn) foil, stainless steel foil, and titanium foil. The sealing layer 130 may be manufactured by attaching thin film metal to the adhesive resin layer 120.

When the resin layer 120 comprises a sealant, the sealing layer 130 may include at least one selected from a group consisting of aluminum, copper, bronze, silver, brass (Cu/Zn), stainless steel, titanium, SiOx, SiNx, SiONx, AlOx, AlONx and AlNx. A metal film or an inorganic film may be formed on the cured sealant by a sputtering method or a evaporation method.

As indicated by 'a' in FIG. 1, the sealing layer 130 may contact the insulating substrate 100 through the depressed portion 125 of the resin layer when wire lines are not provided below the sealing layer 130. As an alternative embodiment, if wire lines are provided below the sealing layer 130, the sealing layer 130 extending into the depressed portion 125 may be spaced apart from the insulating substrate 100 at a predetermined distance.

According to the first exemplary embodiment of the present invention, the OLED 1 has a structure in which the sealing layer 130 surrounds the side of the display element 110. This configuration makes it possible to prevent moisture and oxygen from permeating into the display element 110. Particularly, since oxygen and moisture that permeate between the insulating substrate 100 and the sealing layer 130 can reach the organic light emitting layer 116 only after passing through a plurality of layers, including the resin layer 120 and the sealing layer 130, the amount of oxygen and moisture which permeates into the display element 110 may be minimized, thereby improving the display device's performance and durability.

Hereinafter, a method of manufacturing the display device according to the first exemplary embodiment of the present invention will be described with reference to FIG. 3A, FIG. 3B, FIG. 3C, FIG. 3D, FIG. 3E, and FIG. 3F. In this embodiment, the formation of a resin layer through a taping process will be described.

Figure 3A:
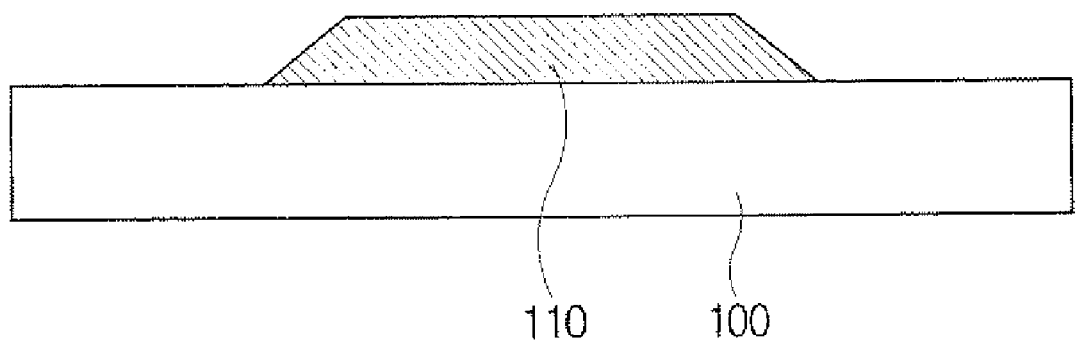
FIG. 3A, FIG. 3B, FIG. 3C, FIG. 3D, FIG. 3E, and FIG. 3F are sequential views showing a manufacturing method of the display device according to the first exemplary embodiment of the present invention.
Figure 3B:
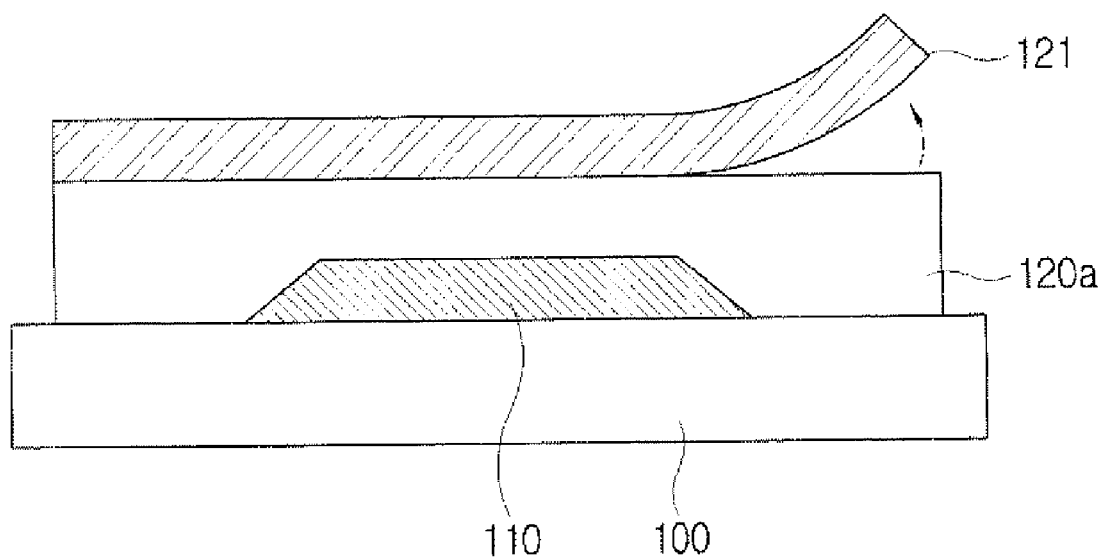

First, as shown in FIG. 3A, the display element 110 is formed on the insulating substrate 100. The display element 110 includes an organic light emitting layer 116 (see FIG. 2), which includes self-emission elements. However, the durability and performance of the organic light emitting layer 116 may be deteriorated by oxygen and moisture. Thus, a sealing process may be performed to protect the organic light emitting layer 116 from oxygen and moisture.

Next, as shown in FIG. 3B, in order to protect the organic light emitting layer 116, the resin layer 120 may be disposed on the insulating substrate 100 such that it covers the display element 110. The resin layer 120 may be made of an adhesive polymer material and includes the semi-curable adhesive resin 120a formed by the taping process. The taping process refers to the process of attaching the semi-curable tape, which includes a polymer film 121, such as PET, and a semi-curable adhesive resin 120a disposed on the polymer film 121, to the insulating substrate 100 on which the display element 110 is disposed, by using mechanical force, and then detaching the polymer film 121 from the semi-curable tape 120a. The resin layer 120 serves to protect the organic light emitting layer 116 from moisture and oxygen and is bonded together with the sealing layer 130, which will be described below.

Figure 3C:
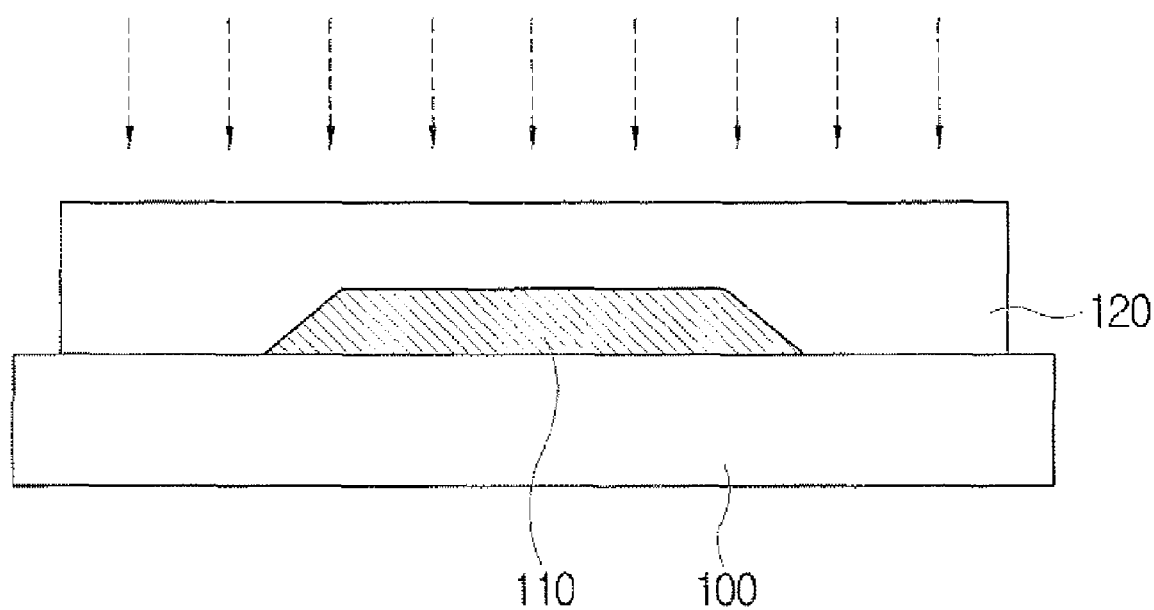

Thereafter, as shown in FIG. 3C, the formed resin layer 120 is semi-cured by at least one of heat and light. A semi-cured state refers to a partially-cured state. Once the resin layer 120 is in a semi-cured state, it may be formed into a desired shape, which the resin layer will maintain thereafter, by the applying pressure.

Figure 3D:
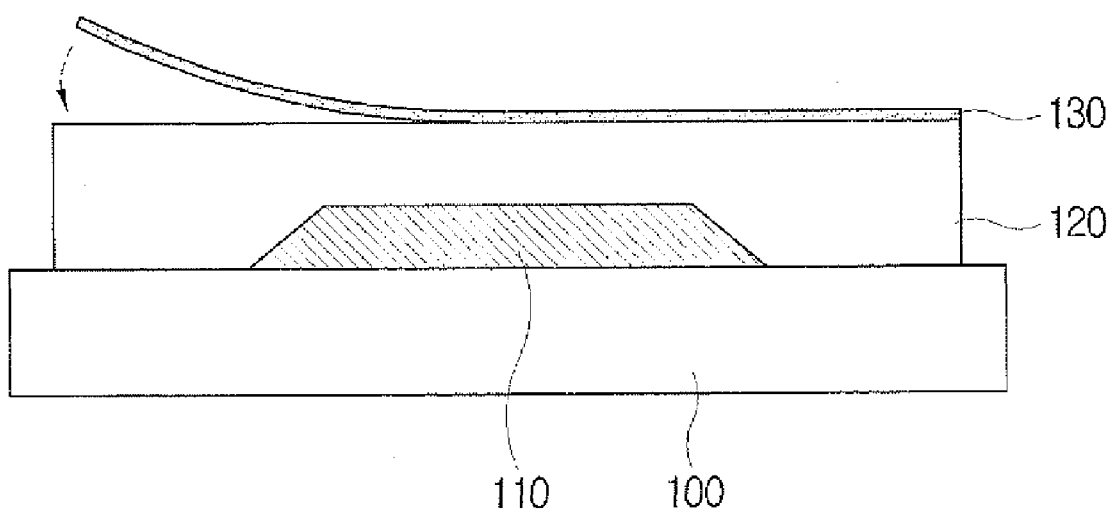

As shown in FIG. 3D, the sealing layer 130 is disposed on the resin layer 120. The sealing layer 130 includes a metal thin film that protects the organic light emitting layer 116 because it may permit very little infiltration by moisture and oxygen. It is preferable, but not necessary, that the metal thin film used as the sealing layer 130 have flexibility so that the sealing layer 130 may extend into the depressed portion 125 of the resin layer 120 without being cut during a pressing process. For example, the sealing layer 130 may include at least one of flexible aluminum foil, copper foil, bronze foil, silver foil, brass (Cu/Zn) foil, stainless steel foil and titanium foil. The sealing layer 130 may be manufactured by attaching a thin film metal to the adhesive resin layer 120.

Figure 3E:
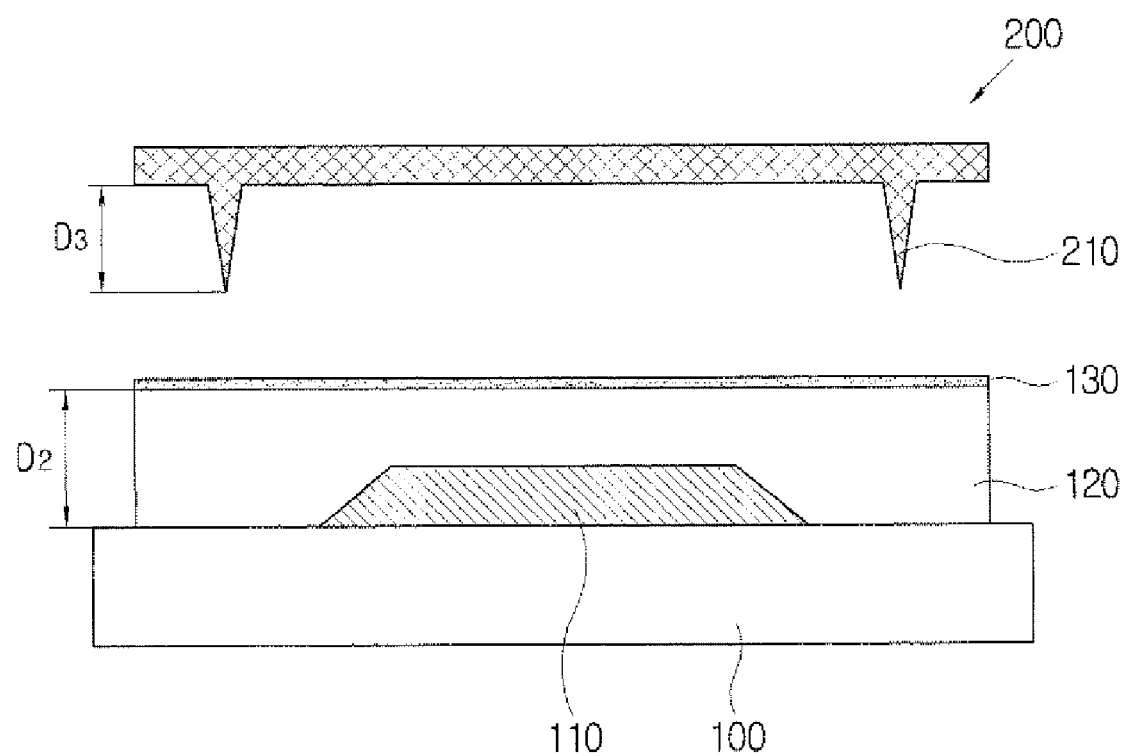

Next, as shown in FIG. 3E, a pressurizing member 200 is arranged over the sealing layer 130. In this exemplary embodiment, the pressurizing member 200 has a plate shape of a predetermined thickness. Projections 210, which project toward the insulating substrate 100, are disposed at an edge of the pressurizing member 200. The projections 210 extend along the edge of the pressurizing member 200. It is preferable, but not necessary, that the length D3 of the projections 210 is equal to or smaller than the thickness D2 of the resin layer 120. If the length D3 of the projections 210 is too small, it may not be possible for the sealing layer 130 to be sufficiently pressed such that it approaches the insulating substrate 100 in the pressing process, which will be described below. That is, as the distance between the sealing layer 130 and the insulating substrate 100 increases, permeation by moisture and oxygen into the display element 110 may not be effectively prevented. Conversely, if the projections 210 are too long, the sealing layer 130 may contact wire lines disposed on the insulating substrate 100, which may result in short-circuits. Accordingly, in determining the length D3 of the projections 210, one should consider that the thickness of the resin layer 120 will decrease during the pressing process. Preferably, the projections 210 have a length such that the projections 210 do not contact the wire lines disposed on the insulating substrate 100. The pressurizing member 200 is arranged such that the projections 210 correspond to the outer sides of the display element 110.

Figure 3F:
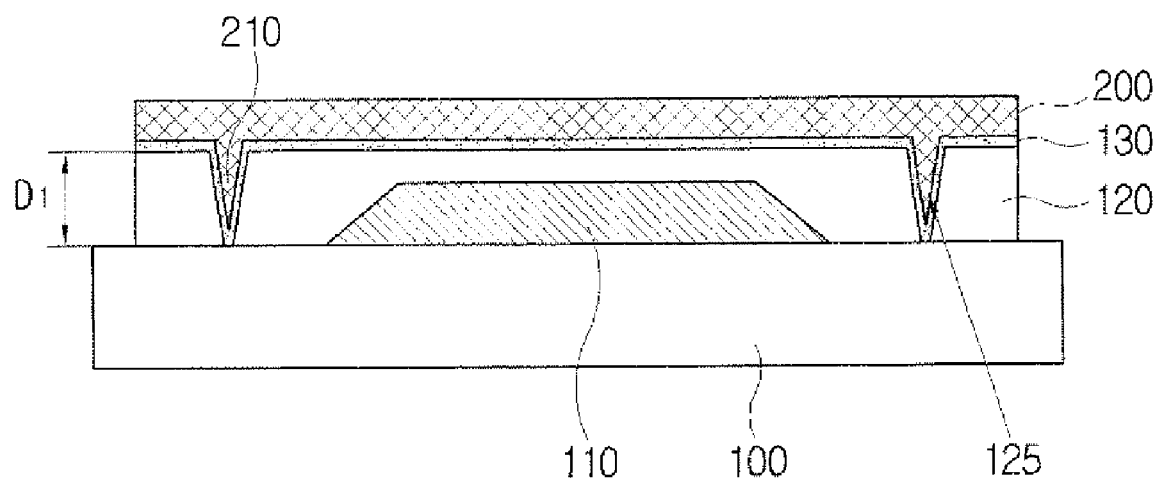

Next, as shown in FIG. 3F, the process of pressing the sealing layer 130 toward the insulating substrate 100 with the pressurizing member 200 is performed. The depressed portion 125 is formed in the resin layer 120 by the projections 210, and the sealing layer 130 extend into the depressed portion 125 of the resin layer 120.

In this embodiment, it is preferable, but not necessary, that the sealing layer 130 be pressed until it contacts the insulating substrate 100 if wire lines are not disposed in the region, and that the sealing layer 130 be pressed to a point that it does not contact the insulating substrate 100 if wire lines are disposed in the region. If a portion of the sealing layer 130 is provided that does not contact the insulating substrate 100, it is preferable, but not necessary, that the thickness of the resin layer 120 between the sealing layer 130 and the insulating substrate 100 (at the depressed portion 125) is small so that the amount of oxygen and moisture which may permeate through the side of the resin layer 120 may be minimized. The thickness of the semi-curable adhesive resin 120a formed on the polymer film 121 is typically 15 μm to 50 μm, and the thickness D1 (see FIG. 1) of the resin layer 120 formed by the taping process becomes smaller during the pressing process. Since a resin layer 120 formed by the taping process is typically thinner than a resin layer including a sealant, the resin layer 120 formed by the taping process may more effectively decrease the amount of oxygen and moisture that may permeate into the side of the resin layer 120, as compared with the resin layer including the sealant. Finally, the OLED 1 shown in FIG. 1 is completed when the pressurizing member 200 is separated from the sealing layer 130.

A method of manufacturing a display device according to a second exemplary embodiment of the present invention will be described with reference to FIG. 4A, FIG. 4B, FIG. 4C, FIG. 4D, and FIG. 4E. In this exemplary embodiment, the formation of a resin layer 120 including a sealant will be described. In the following description, characteristic portions that distinguish the second exemplary embodiment from the first exemplary embodiment will be explained and omitted or summarized portions are formed or manufactured according to the manufacturing method of the first exemplary embodiment and known techniques. Like elements in the first and second exemplary embodiments are denoted by the like reference numerals for the purpose of convenience.

Figure 4A:
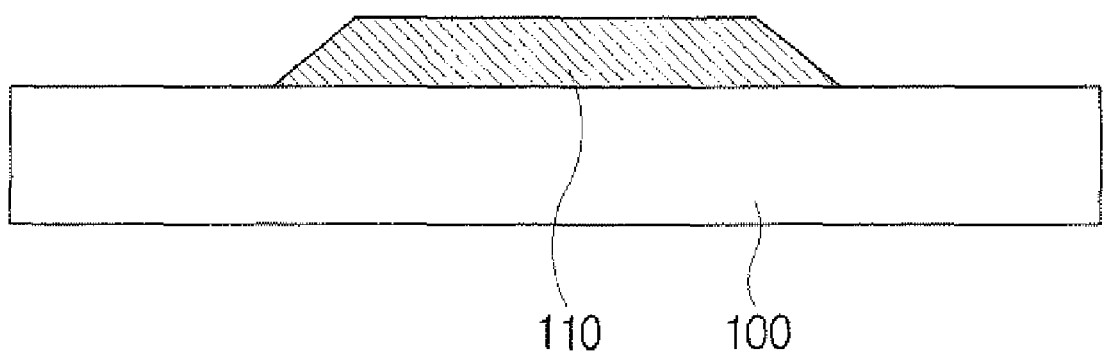
FIG. 4A, FIG. 4B, FIG. 4C, FIG. 4D, and FIG. 4E are sequential views showing a manufacturing method of a display device according to a second exemplary embodiment of the present invention.

First, as shown in FIG. 4A, a display element 110 is formed on an insulating substrate 100.

Figure 4B:
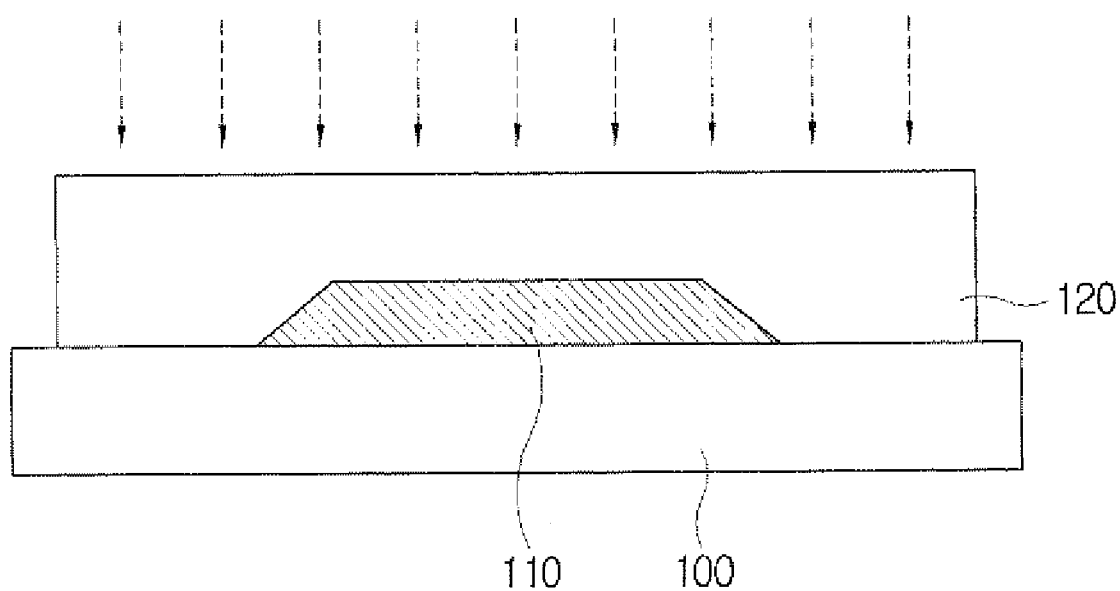

Next, as shown in FIG. 4B, a resin layer 120 is formed on the insulating substrate 100 such that it covers the display element 110. In this embodiment, the resin layer 120 includes a sealant. The sealant may be made of an adhesive organic material and comprises an epoxy resin, an acryl resin, or the like. The sealant may achieve a semi-cured or fully-cured state by controlling the level of radiation by light and the time for which the sealant is exposed to it, as well as the time and level at which heat is applied to the sealant. The sealant serves to protect the organic light emitting layer 116 from moisture and oxygen and also, to bond the sealing layer 130 and the resin layer 120 together. The resin layer 120 may be formed by screen printing, coating, dispensing or other methods. After forming the resin layer 120, it may be semi-cured using at least one of heat and light.

Figure 4C:
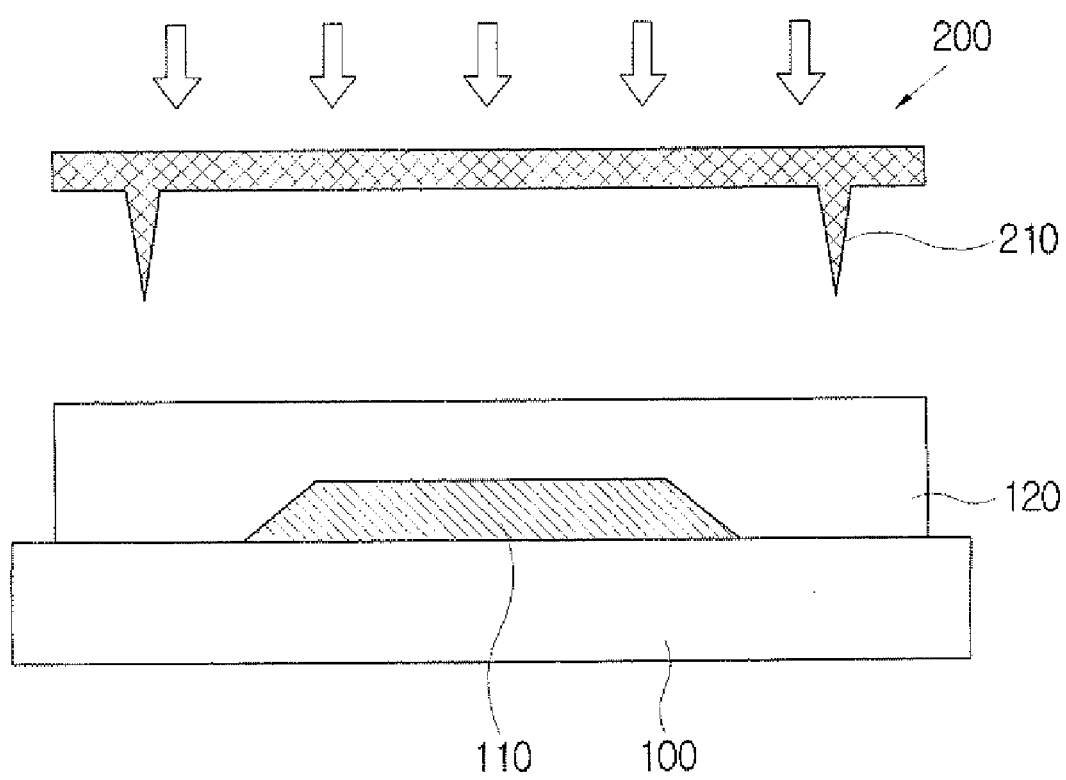

Thereafter, as shown in FIG. 4C, a pressurizing member 200 having at least one projection 210 is arranged over the resin layer 120. Then, the process of pressing the resin layer 120 toward the insulating substrate 100 with the pressurizing member 200 is performed.

Figure 4D:
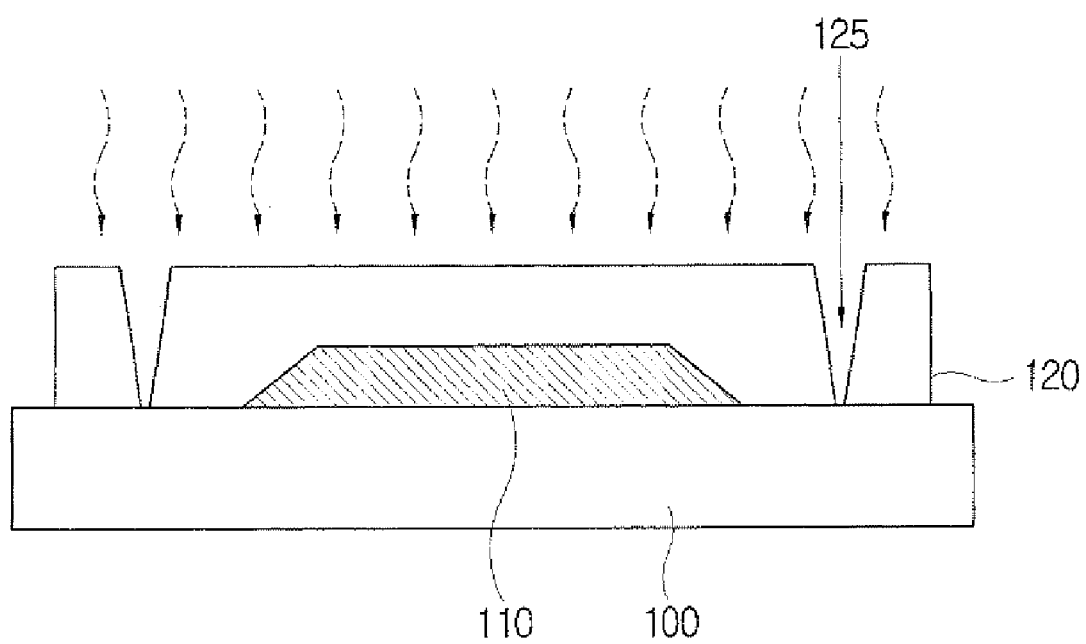

Next, after forming a depressed portion 125 is formed in the resin layer 120 during the pressing process, a sputtering or deposition process is used to form a sealing layer 130 (see FIG. 4E), as shown in FIG. 4D. Material to be sputtered or deposited may include at least one of metal or inorganic material. More specifically, the material may include at least one of aluminum, copper, bronze, silver, brass (Cu/Zn), stainless steel, titanium, $SiO_x$, $SiN_x$, $SiON_x$, $AlO_x$, $AlON_x$, and $AlN_x$. In this exemplary embodiment, it is preferable, but not necessary, that the sputtering or evaporation process be performed such that the material to be sputtered or deposited is uniformly filled into the depressed portion 125 of the resin layer 120.

Figure 4E:
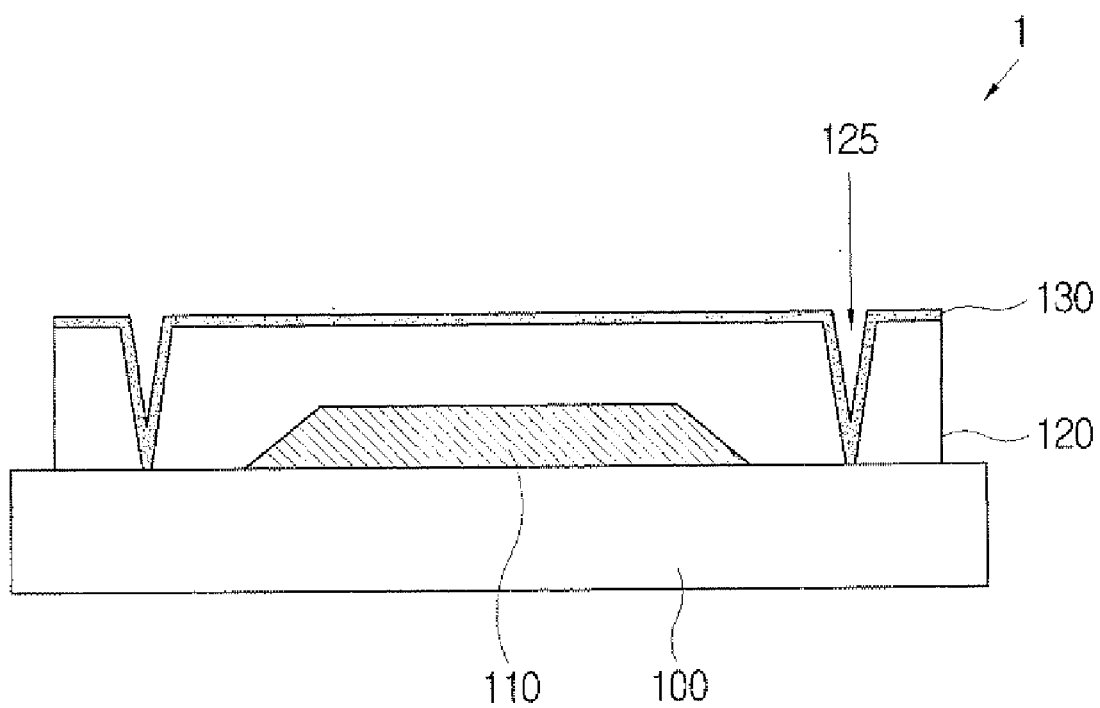

As shown in FIG. 4E, the sealing layer 130 extends into the depressed portion 125 once the sputtering or deposition process is completed. Finally, the OLED 1 is completed by fully curing the resin layer 120.

According to the second exemplary embodiment of the present invention, the OLED 1 has a structure in which the sealing layer 130 surrounds the side of the display element 110. This makes it possible to prevent moisture and oxygen from permeating into the display element 110. Particularly, since oxygen and moisture permeating between the insulating substrate 100 and the sealing layer 130 can reach the organic light emitting layer 116 only after passing a plurality of layers, including the resin layer 120 and the sealing layer 130, the amount of oxygen and moisture which permeates into the display element 110 may be minimized, thereby improving the display device's performance and durability.

Hereinafter, display devices according to third, fourth, and fifth exemplary embodiments of the present invention will be described with reference to FIG. 5, FIG. 6, and FIG. 7, respectively. In the following description, characteristic portions that distinguish these embodiments from the above first and second exemplary embodiments will be explained and omitted or summarized portions are formed or manufactured according to the manufacturing method of the above first and second exemplary embodiments and known techniques. Like elements in these exemplary embodiments and the first and second exemplary embodiments are denoted by like reference numerals for the purpose of convenience.

Figure 5:
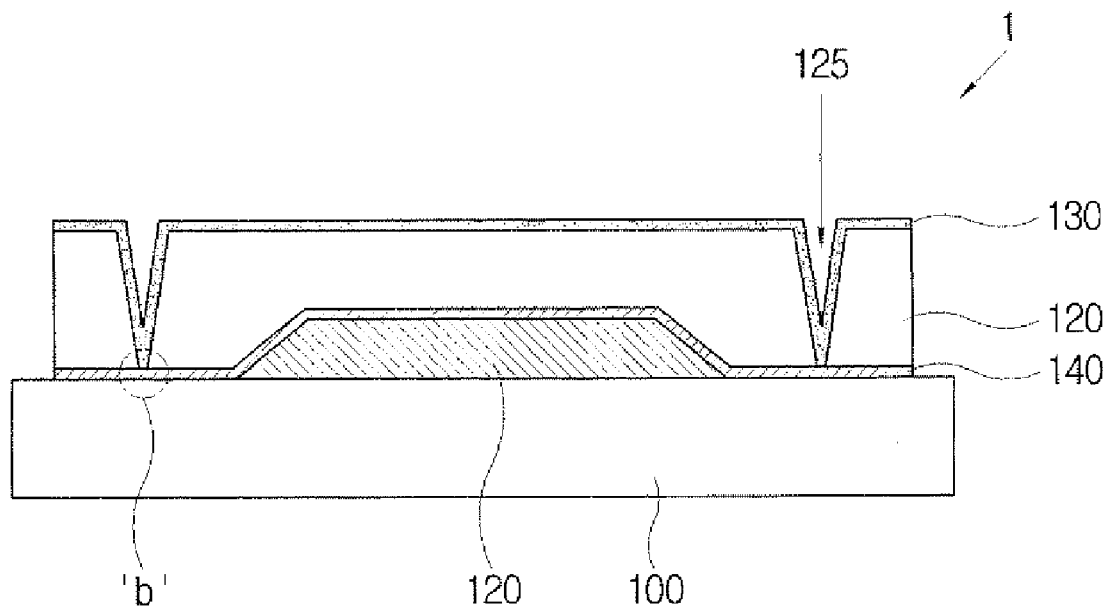
FIG. 5, FIG. 6, and FIG. 7 are views showing display devices according to third, fourth, and fifth exemplary embodiments of the present invention, respectively.

FIG. 5 is a view showing a display device according to a third exemplary embodiment of the present invention. As shown in FIG. 5, an inorganic insulating layer 140 is further disposed on an insulating substrate 100 such that it covers the display element 110. When the length of a projection 210 (see FIG. 3D) exceeds the thickness of the resin layer 120 or high pressure is applied to the projection 210 during the pressing process, the inorganic insulating layer 140 serves to prevent the sealing layer 130 from contacting wire lines disposed on the insulating substrate 100. That is, the inorganic insulating layer 140 may prevent short-circuits. In addition, the inorganic insulating layer 140 also serves to protect the display element 110 from permeation by moisture and oxygen. As an alternative embodiment, the inorganic insulating layer 140 may be disposed on only the edge of the insulating substrate 100 at which the depressed portion 125 in the resin layer 120 is formed.

Figure 6:
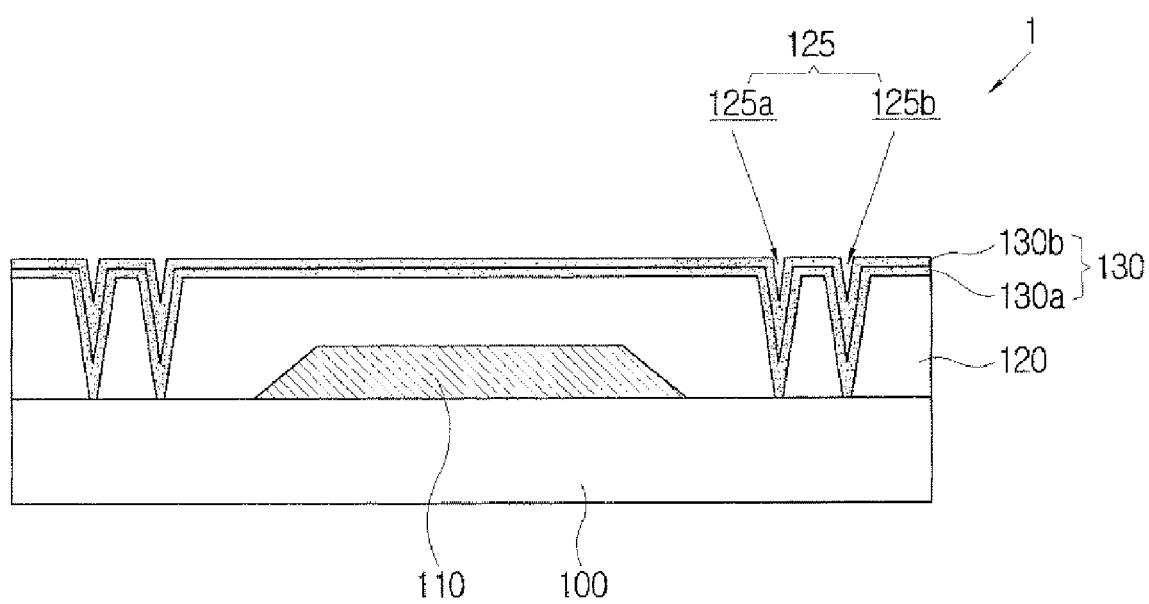

FIG. 6 is a view showing a display device according to a fourth exemplary embodiment of the present invention. As shown in FIG. 6, multiple depressed portions 125 are provided in the resin layer 120. Specifically, the depressed portion 125 includes a first depressed portion 125a, formed on the outer side of an insulating substrate 100, and a second depressed portion 125b adjacent to the first depressed portion 125a, with a predetermined interval between them. As shown in FIG. 6, multiple sealing layers 130 are also provided. Specifically, a sealing layer 130 includes a first sealing layer 130a and a second sealing layer 130b formed on the first sealing layer 130a. The first sealing layer 130a and the second sealing layer 130b may be made of the same or different material. Accordingly, since oxygen and moisture permeating between the insulating substrate 100 and the sealing layer 130 can reach the organic light emitting layer only after passing through more layers than in the first exemplary embodiment, the display device's performance and durability.

Figure 7:
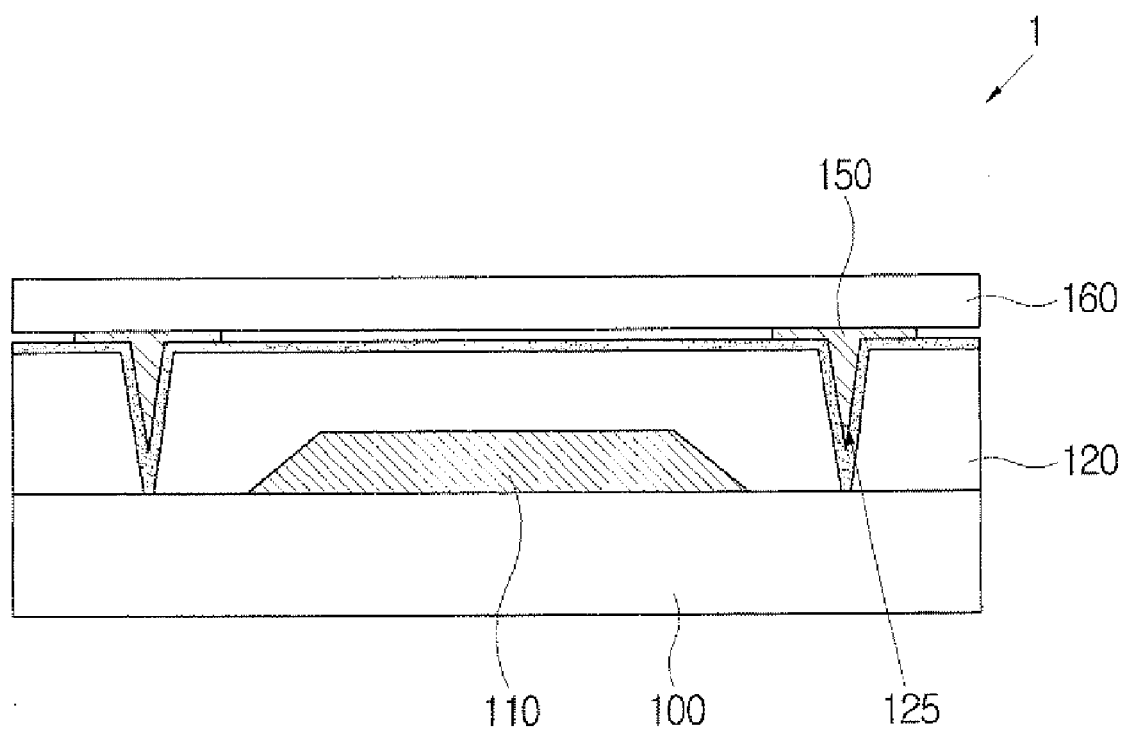

FIG. 7 is a view showing a display device according to a fifth exemplary embodiment of the present invention. As shown in FIG. 7, a cover substrate 160 is disposed on the sealing layer 130, and an adhesive member 150 is provided between the sealing layer 130 and the cover substrate 160 to bond the sealing layer 130 and the cover substrate 160 together. In this embodiment, the cover substrate 160 serves to prevent oxygen and moisture from permeating through the top of the OLED 1. The adhesive member 150 bonds the sealing layer 130 and the cover substrate 160 together, fills a space defined by a depressed portion 125 in the resin layer 120, and serves to prevent oxygen and moisture from permeating from through the side of the OLED 1. Accordingly, in this exemplary embodiment, it may be possible to more effectively prevent oxygen and moisture from permeating through the top and sides of the OLED 1.

As apparent from the above description, the present invention provides a display device that may allow for minimal infiltration by oxygen and moisture.

In addition, the present invention provides a method of manufacturing a display device that may allow for minimal infiltration by oxygen and moisture.

It will be apparent to those skilled in the art that various modifications and variations may be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
   an insulating substrate;
   a display element on the insulating substrate;
   a resin layer disposed on the display element and having a depressed portion disposed along an edge of the insulating substrate; and
   a sealing layer disposed on the resin layer, wherein a portion of the sealing layer extends into the depressed portion of the resin layer,
   wherein both the resin layer and the sealing layer overlap the display element; and wherein the display element comprises an organic light emitting layer, and both the resin layer and the sealing layer are disposed on the same side of the organic light emitting layer at a portion where the resin layer and the sealing layer overlap the organic light emitting layer.

2. The display device of claim 1, wherein the resin layer comprises a sealant or a semi-curable adhesive resin formed by a taping process, and
wherein the semi-curable adhesive resin is provided to receive a mechanical force for pressing the resin layer and a thickness of the semi-curable adhesive resin is between about 15 μm and about 50 μm.

3. The display device of claim 2, wherein the semi-curable adhesive resin is partially cured and the sealant is fully cured.

4. The display device of claim 3, wherein a plurality of depressed portions are formed in the resin layer at predetermined intervals.

5. The display device of claim 3, wherein the sealing layer comprises at least one of a metal and an inorganic material.

6. The display device of claim 5, wherein the sealing layer selectively contacts the insulating substrate through the depressed portion of the resin layer.

7. The display device of claim 5, wherein the sealing layer comprises a plurality of sealing layers.

8. The display device of claim 5, wherein the resin layer comprises the semi-curable adhesive resin, and the sealing layer comprises at least one selected from a group comprising aluminum foil, copper foil, bronze foil, silver foil, brass (Cu/Zn) foil, stainless steel foil, and titanium foil.

9. The display device of claim 8, further comprising an inorganic insulating layer disposed between the resin layer and the insulating substrate,
wherein the sealing layer selectively contacts the inorganic insulating layer through the depressed portion of the resin layer.

10. The display device of claim 9, wherein the inorganic insulating layer covers the display element.

11. The display device of claim 5, wherein the resin layer comprises the sealant, and the sealing layer comprises at least one selected from the group consisting of aluminum, copper, bronze, silver, brass (Cu/Zn), stainless steel, titanium, $SiO_x$, $SiN_x$, $SiON_x$, $AlO_x$, $AlON_x$, and $AlN_x$.

12. The display device of claim 1, wherein the depressed portion comprises a first portion and a second portion, and
wherein the sealing layer contacts an upper surface of the insulating substrate in the first portion of the depressed portion, and the sealing layer does not contact the upper surface of the insulating substrate in the second portion of the depressed portion.

* * * * *